(12) United States Patent
Hon

(10) Patent No.: US 11,917,345 B2
(45) Date of Patent: Feb. 27, 2024

(54) MODULAR ASSEMBLY FOR PROVIDING TELECOMMUNICATIONS AND INTERNET SERVICES AND METHOD OF INSTALLATION THEREOF

(71) Applicant: XIBER, LLC, Indianapolis, IN (US)

(72) Inventor: Stephen Hon, Indianapolis, IN (US)

(73) Assignee: Xiber, LLC, Indianapolis, IN (US)

( * ) Notice: Subject to any disclaimer, the term of this patent is extended or adjusted under 35 U.S.C. 154(b) by 210 days.

(21) Appl. No.: 17/497,268

(22) Filed: Oct. 8, 2021

(65) Prior Publication Data

US 2022/0030332 A1 Jan. 27, 2022

Related U.S. Application Data

(62) Division of application No. 16/670,417, filed on Oct. 31, 2019, now Pat. No. 11,146,866.

(60) Provisional application No. 62/753,314, filed on Oct. 31, 2018.

(51) Int. Cl.
| | |
|---|---|
| *H04B 1/38* | (2015.01) |
| *H04Q 1/28* | (2006.01) |
| *H05K 9/00* | (2006.01) |
| *H04B 10/2575* | (2013.01) |
| *H05K 7/14* | (2006.01) |
| *H04Q 1/02* | (2006.01) |

(52) U.S. Cl.
CPC ......... *H04Q 1/28* (2013.01); *H04B 10/25758* (2013.01); *H04Q 1/025* (2013.01); *H05K 7/1457* (2013.01); *H05K 9/0037* (2013.01); *H05K 9/0062* (2013.01)

(58) Field of Classification Search
CPC .... H01Q 1/28; H01Q 1/025; H04B 10/25758; H04B 10/2581; H04B 10/25891; H04B 7/06; H04B 7/14; H04B 10/29
See application file for complete search history.

(56) References Cited

U.S. PATENT DOCUMENTS

| | | | | |
|---|---|---|---|---|
| 5,209,361 | A  * | 5/1993 | Grubb, Jr. | B66C 13/16 |
| | | | | 212/250 |
| 2010/0212253 | A1 * | 8/2010 | Fex, Jr. | E04H 9/14 |
| | | | | 52/741.3 |
| 2011/0175444 | A1 * | 7/2011 | Yunes | F01K 13/00 |
| | | | | 307/23 |
| 2012/0286997 | A1 * | 11/2012 | Lin | G01S 5/0252 |
| | | | | 342/451 |
| 2017/0141841 | A1 * | 5/2017 | Clemmensen | H04B 7/1858 |

* cited by examiner

*Primary Examiner* — Tuan Pham
(74) *Attorney, Agent, or Firm* — Taft Stettinius & Hollister LLP; Derek B. Lavender

(57) ABSTRACT

A method for providing wireless telecommunications. The method includes providing a modular remote radio unit (RRU) capable of wirelessly transmitting data, placing the modular RRU on a boom truck with a boom arm, transporting the remote radio unit to a deployment location, setting the modular RRU on a structure at the deployment location by lifting the modular RRU off the boom truck with the boom arm, electrically coupling a power input of the modular RRU to a power source to power the modular RRU, and transmitting and receiving wireless data with the modular RRU unit after the power input is coupled to the power source.

9 Claims, 6 Drawing Sheets

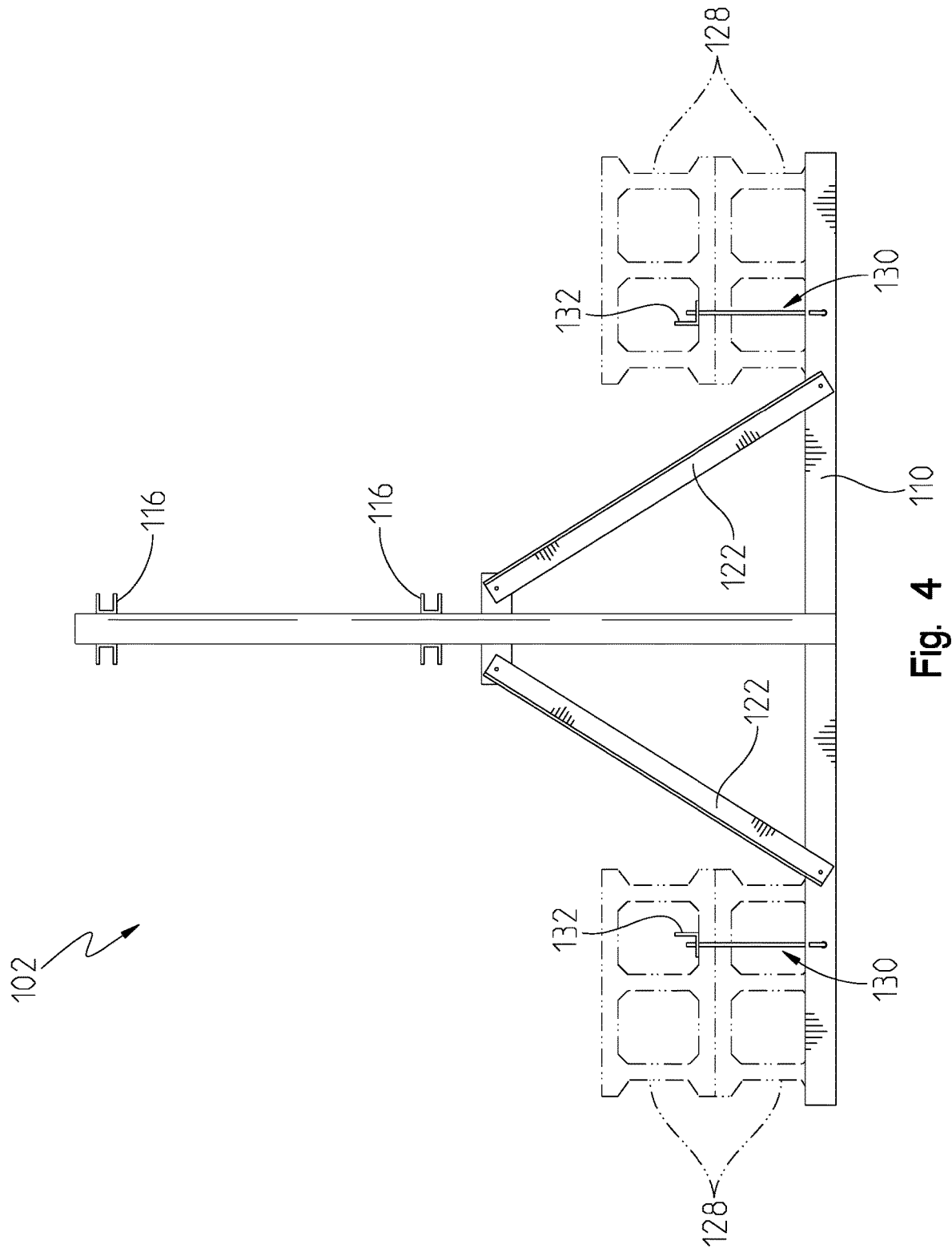

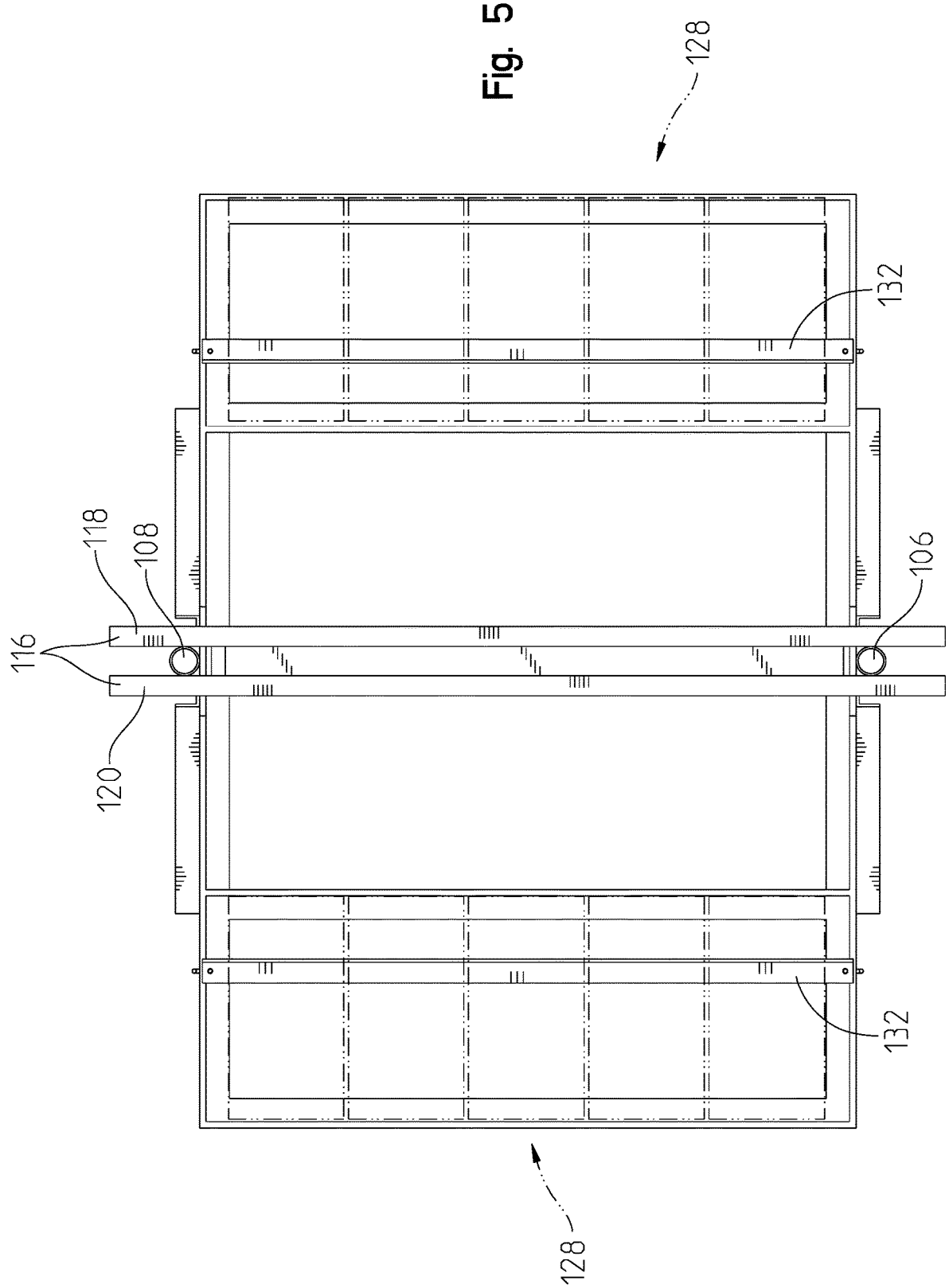

MODULAR ASSEMBLY FOR PROVIDING TELECOMMUNICATIONS AND INTERNET SERVICES AND METHOD OF INSTALLATION THEREOF

CROSS-REFERENCE TO RELATED APPLICATIONS

The present disclosure is a divisional of U.S. application Ser. No. 16/670,417 filed Oct. 31, 2019 and which claims the benefit of U.S. Provisional Application No. 62/753,314 filed on Oct. 31, 2018, both titled "Modular Assembly for Providing Telecommunications and Internet Services and Method of Installation Thereof," the contents of which are incorporated herein in their entirety.

TECHNICAL FIELD

This disclosure relates to a wireless data distribution module, and more specifically, to wireless data distribution module that is contained within a single modular assembly.

BACKGROUND

Wireless transmission systems currently implemented for long-range wireless communication are typically permanent or semi-permanent systems designed for continuous use in a single location. The typical transmission system often has electrical and structural demands that require the system to be substantially fixed to one specific location. More specifically, a typical transmission system has one or more antenna fixed to a mast that is permanently coupled to the ground or other body. The antennas often provide both communication from the transmission system to a data source that is a wireless communication location and communication from the transmission system to an end user or users.

The conventional transmission system requires precise alignment of the antenna to properly function. Further, the antenna is typically positioned on a mast assembly and/or other elevating member, which allows the antenna to communicate more efficiently by bypassing obstructions on the ground. Accordingly, the mast assembly is large enough to allow the antenna to bypass the ground obstructions and rigid enough to ensure the antenna does not substantially deviate from the desired alignment. To facilitate such a mast assembly configuration, the mast assembly is frequently anchored into the ground with a permanent or semi-permanent coupler. As one example, the mast assembly is often anchored to a cement foundation or other stationary structural component with one or more fastening assembly. Alternatively, the base of the mast assembly can be encased in cement to ensure that mast assembly does not substantially move. In other examples, the mast assembly has a plurality of wires positioned around the mast assembly and fastened to the ground to provide additional structural support.

The conventional transmission system is typically a split system such that the mast assembly that the antenna is positioned on thereby supporting the antenna is typically positioned at an outdoor position in order to be adequately aligned to efficiently engage in wireless communication. However, the electrical components of the conventional transmission system are typically positioned at an indoor location and separated from the mast assembly and antenna. The conventional transmission system incorporates the electrical components that are positioned at the indoor location such that the electrical components are coupled to the antenna via extensive cabling that is routed from the position of the electrical components to the outdoor position of the mast assembly and antenna in order to properly send and receive data. These electrical components are susceptible to damage from extreme weather conditions such as rain, snow, sleet, heat, cold, and the like conditions. Accordingly, the conventional transmission system often houses the electrical components at the indoor position in a permanent structure such as a shed, a small building, and/or the structure that the conventional transmission system is positioned on. The shed, small building, and/or structure is often fixed to the ground to keep the electrical components adequately shielded during extreme weather conditions.

The conventional transmission system also requires dedicated high-power electrical connections to a power grid in order to properly power the electrical components and the antenna. The high power electrical connections are often permanently routed to the indoor position of the electrical components as well as the outdoor position of the mast configuration of the conventional transmission system for dedicated use by the conventional transmission system. The conventional transmission system requires access to a high-power electrical source to adequately power the electrical components as well as the antenna. The high-power electrical source required by the conventional transmission system requires power that is significantly greater than a standard 120V, 20 A electrical line that is common in residential and commercial buildings. Accordingly, the typical transmission system requires high-power electrical lines to be routed to the indoor location of the electrical components as well as the outdoor position of the mast assembly to function properly.

Accordingly, the conventional transmission system is often permanently installed in split locations. More specifically, the mast configuration and the antenna are permanently mounted at the outdoor position and the electrical components are permanently mounted at the indoor location and neither the mast configuration and the antenna mounted or the electrical components can be routinely moved without significant effort, time, and/or cost. During the installation process, the mast configuration is permanently secured to the underlying surface at the outdoor position. Further, the electrical components are permanently mounted and housed at the indoor location that provides relief from extreme weather conditions. Dedicated electrical connections and high-power electrical cabling is provided to the antenna positioned at the outdoor position and the electrical components positioned at the indoor positon.

Thus, installing the conventional transmission system requires a highly specialized electrician that is certified to route the dedicated high-power electrical connections and high-power cabling to the outdoor position of the antenna and the indoor position of the electrical components. Further, a construction crew must build the mast assembly and a wireless technician must install all of the electrical components of the conventional transmission system. Similarly, if the conventional transmission system is to be moved, a similarly sized crew is required to properly dismantle the conventional transmission system.

Accordingly, there is a need for a modular transmission system that can easily be transported between locations without requiring a large crew with multiple different disciplines to place and power the transmission system.

SUMMARY

One embodiment of this disclosure is a modular remote radio unit assembly that has a frame assembly, electrical components coupled to the frame assembly and configured to provide wireless data transfer, and a single power input for the electrical components. Wherein, when the power input is coupled to a power source, the electrical components are powered to provide wireless data transfer.

Another embodiment is a method for providing wireless telecommunications. The method includes providing a modular remote radio unit (RRU) capable of wirelessly transmitting data, placing the modular RRU on a boom truck with a boom arm, transporting the remote radio unit to a deployment location, setting the modular RRU on a structure at the deployment location by lifting the modular RRU off the boom truck with the boom arm, electrically coupling a power input of the modular RRU to a power source to power the modular RRU, and transmitting and receiving wireless data with the modular RRU unit after the power input is coupled to the power source.

DESCRIPTION OF THE DRAWINGS

The above-mentioned aspects of the present disclosure and the manner of obtaining them will become more apparent and the disclosure itself will be better understood by reference to the following description of the embodiments of the disclosure, taken in conjunction with the accompanying drawings, wherein:

FIG. 4 is a side view of the frame assembly of FIG. 3;

FIG. 5 is a top view of the frame assembly of FIG. 3;

FIG. 6c is a back view of the enclosure of FIG. 3a; and

FIG. 6d is a bottom view of the enclosure of FIG. 3a.

Corresponding reference numerals are used to indicate corresponding parts throughout the several views.

DETAILED DESCRIPTION

The above-mentioned aspects of the present application and the manner of obtaining them will become more apparent and the teachings of the present application itself will be better understood by reference to the following description of the embodiments of the present application taken in conjunction with the accompanying drawings.

Figure 1:
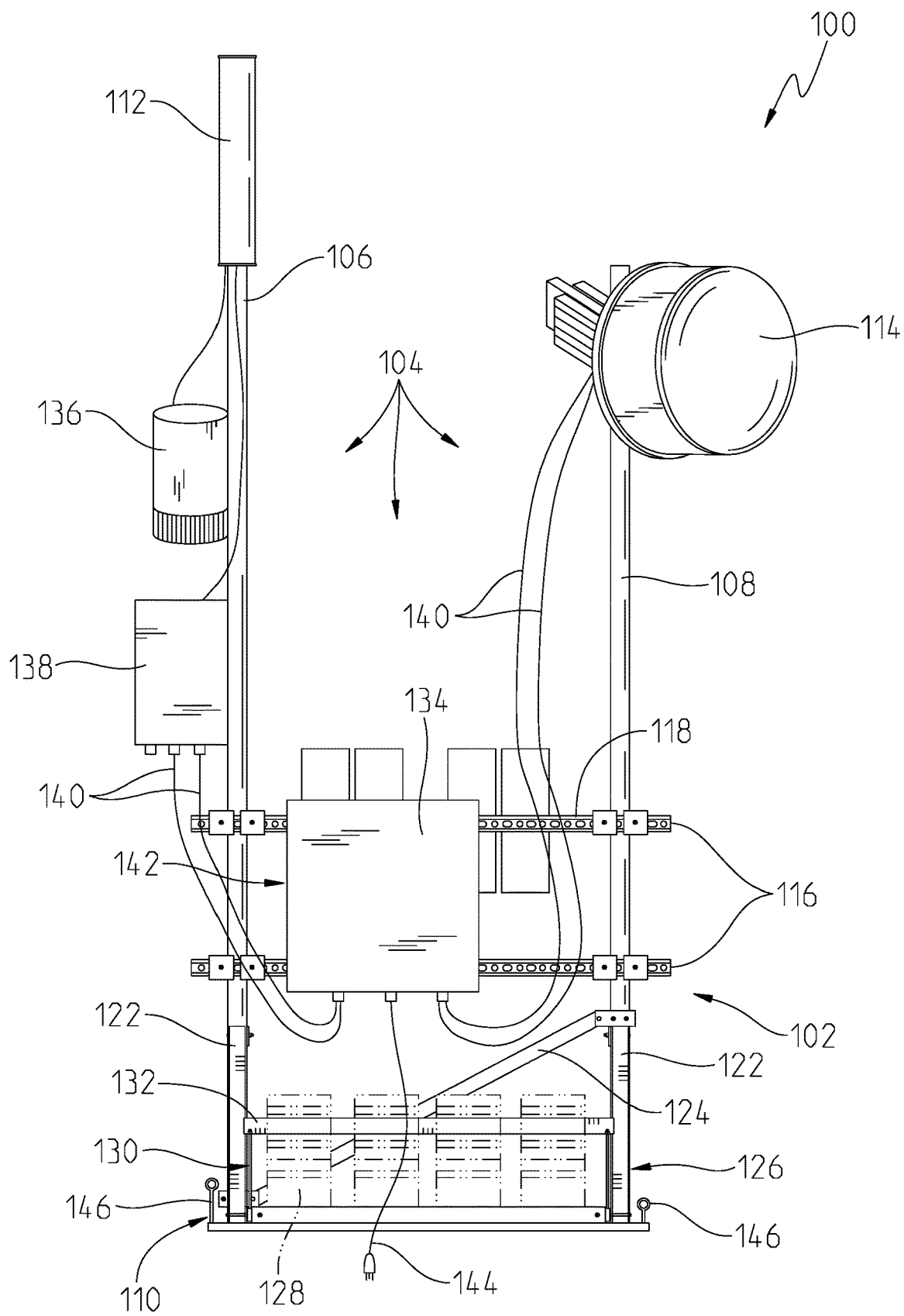
FIG. 1 is a front view of one embodiment of a modular remote radio unit.
Figure 2:
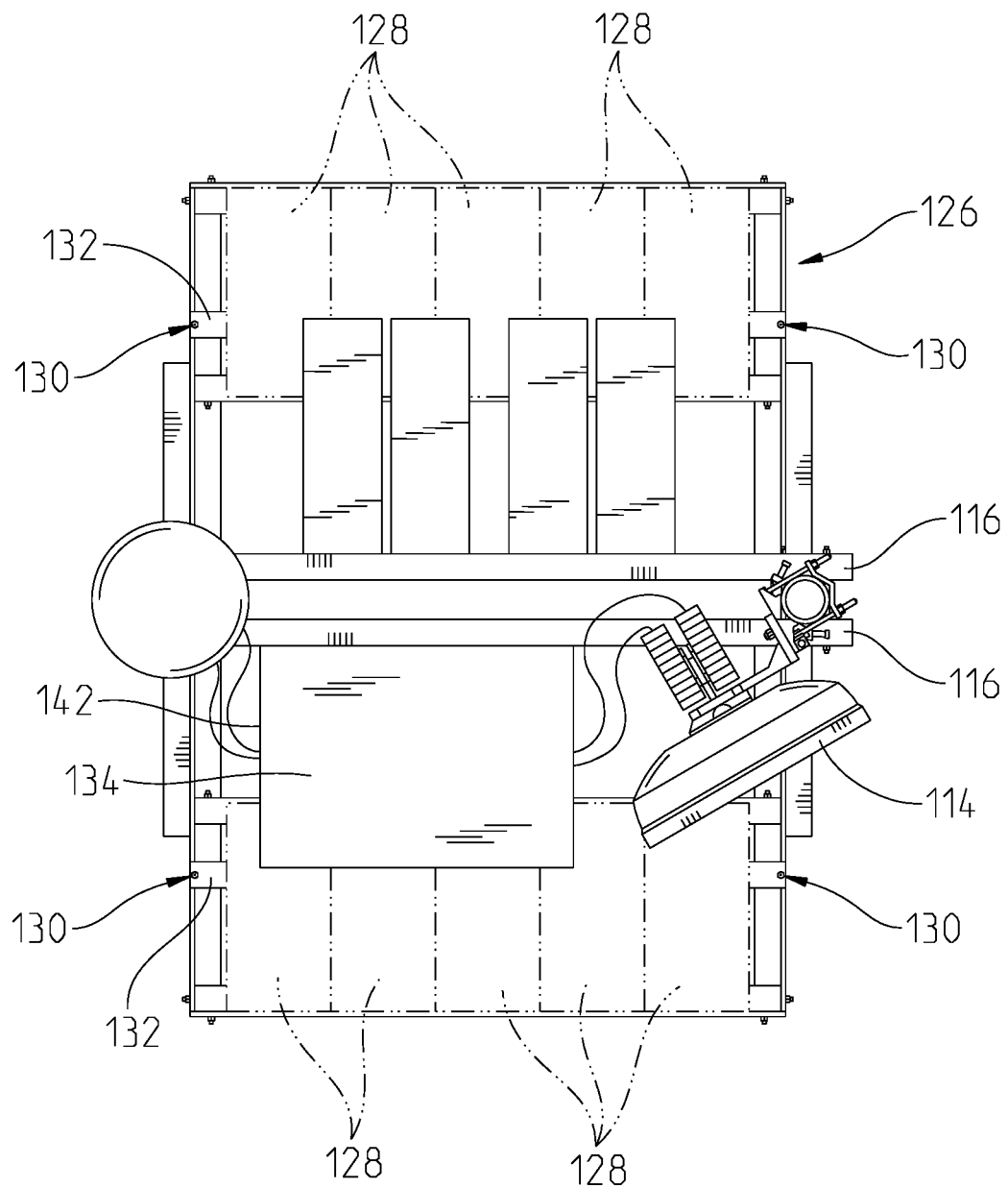
FIG. 2 is a top view of the modular remote radio unit of FIG. 1.
Figure 3:
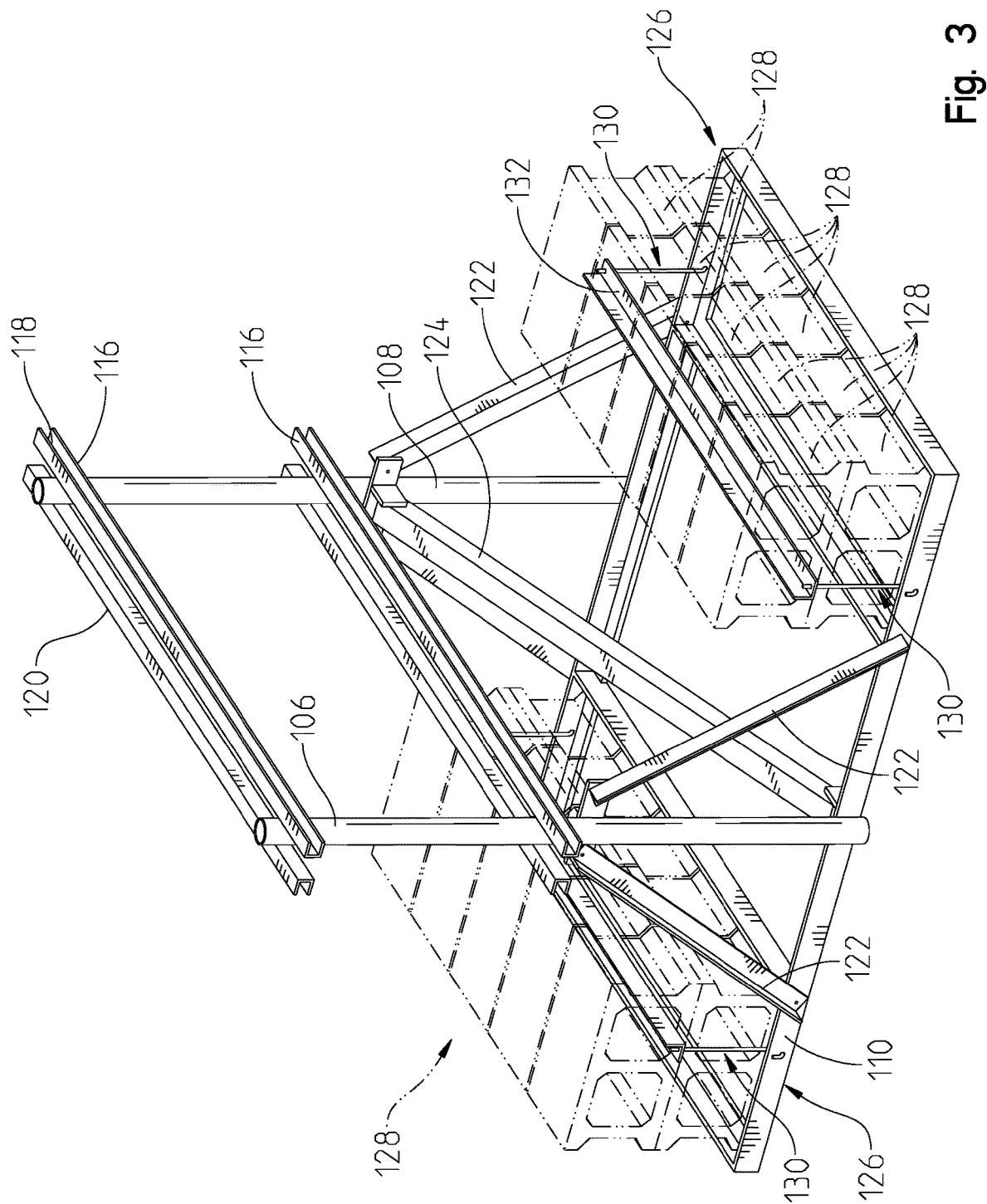
FIG. 3 is an elevated perspective view of a frame assembly of the modular remote radio unit of FIG. 1.
Figure 6A:
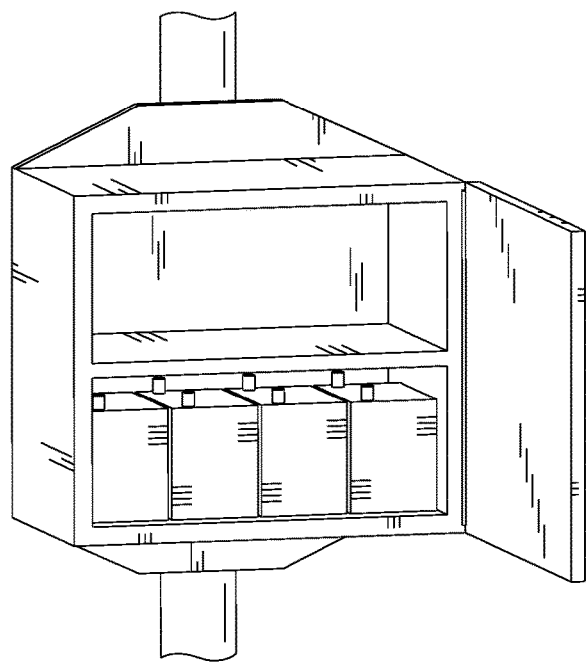
FIG. 6a is a perspective view of an enclosure with a door partially open.
Figure 6B:
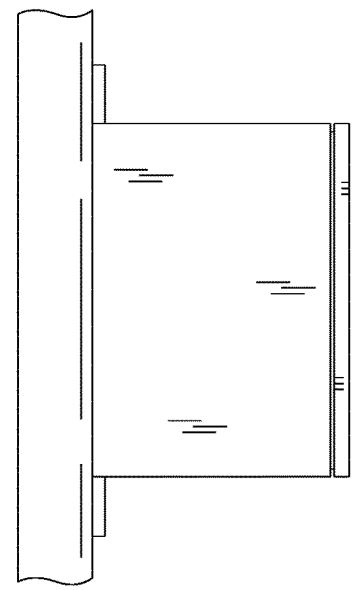
FIG. 6b is a side view of the enclosure of FIG. 3a with the door closed.
Figure 6C:
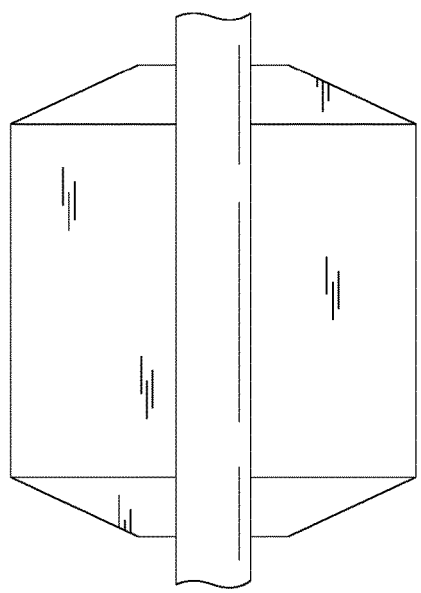
Figure 6D:
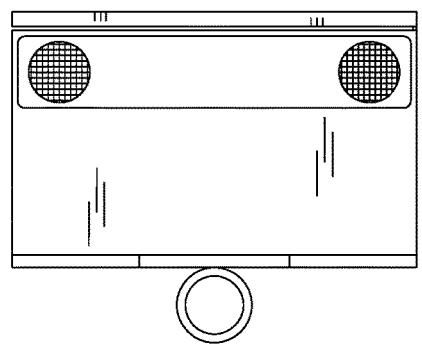

Referring to FIG. 1, a modular Remote Radio Unit (or "RRU") 100, is illustrated. The modular RRU 100 has a frame assembly 102 that may have a plurality of structural components interconnected to one another. The modular RRU 100 is modular such that the modular RRU 100 may be rapidly deployed and installed as a single system, rather than a split system, at a location without requiring a permit to do such installation as will be discussed in more detail below. The frame assembly 102 may provide coupling locations for a plurality of electrical components 104. The frame assembly 102 provides for mounting the electrical components 104 in locations that facilitate the efficient transmission and reception of wireless signals. More specifically, a first and second mast 106, 108 may be a part of the frame assembly 102 and extend from a base portion 110. The base portion 110 may be sized to be positioned along an underlying surface and the masts 106, 108 may extend away from the underlying surface to provide mounting locations for one or more antennas or the like.

More specifically, the electrical components 104 may include a first antenna 112 and a second antenna 114. The first antenna 112 may be coupled to the first mast 106 and the second antenna 114 may be coupled to the second mast 108. The masts 106, 108 may extend sufficiently away from the base portion 110 to allow the respective antennas 112, 114 to effectively send and receive data through wireless transmission. In one non-exclusive example, each antenna 112, 114 may be coupled to the respective mast 106, 108 at more than five feet away from the base portion. Further still, in another non-exclusive example each of the antennas 112, 114 are coupled to the respective masts 106, 108 at more than eight feet from the base portion 110.

In one aspect of this disclosure, the first antenna 112 may be an omnidirectional antenna capable of sending or receiving wireless transmission in substantially three-hundred and sixty degrees about the first antenna 112. In other words, the first antenna 112 may send and received wireless transmission in substantially all directions.

Alternatively, the second antenna 114 may be a dish antenna that sends or receives wireless transmissions along a directional path. The second antenna 114 may be adjusted along the second mast 108 to align the directional path of the second antenna 114 with a data source that is a wireless communication location. Accordingly, in one aspect of this disclosure, the second antenna 114 may rotate entirely around a longitudinal axis defined by the second mast 114 and the angle of the second antenna 114 may be altered relative thereto to alter the directional path of the second antenna 114.

While two specific types of antennas are described herein, this disclosure is applicable to any type of wireless transmission or reception system known in the art. Accordingly, the examples given are not meant to be exhaustive. Further, while two masts are described herein, this disclosure also contemplates utilizing only one mast. In this configuration, the first antenna 112 may be on a top portion of the mast while the second antenna 114 may be on an intermediate portion of the mast between the top portion and the base portion 110. Accordingly, this disclosure considers any antenna placement and number of masts. Further still, other embodiments may have more than two masts and antennas. Accordingly, this disclosure contemplates applying the teachings discussed herein to any number of antenna and mast configurations.

In addition to the masts 106, 108 and the base portion 110, the frame assembly 102 may include one or more cross-member 116 coupled to and extending between the first and second masts 106, 108. The cross-member 116 may be a substantially rigid material that provides additional stability to the masts 106, 108. In one non-exclusive example, there may be at least two cross-members 116 coupled to the first and second masts 106, 108.

In one aspect of this disclosure, the cross-member 116 may be formed from a structural component that provides for a universal mounting of additional equipment. As one non-exclusive example, the cross-member 116 may have a plurality of through holes defined there through. The plurality of through holes allow for easily coupling additional components to the cross-member 116.

In one aspect of this disclosure, each cross-member 116 may be formed from a first member 118 and a second member 120. The first and second members 118 and 120 may be positioned on opposite sides of the masts 106, 108 and be substantially parallel to one another. Further, fasteners may couple the first and second members 118, 120 to one another on opposing sides of each mast 106, 108. The fasteners may apply a clamping force that causes the members 118, 120 to become frictionally locked along the corresponding masts 106. 108. Further, the fasteners may be positioned proximate to the respective masts 106, 108 on opposing sides thereof. Accordingly, the fasteners may further prevent the cross-members 116 from sliding horizontally relative to the masts 106, 108 because they are positioned through the members 118, 120 at locations substantially adjacent to the surface of the corresponding masts 106, 108.

The frame assembly 102 may include at least one fore-aft support structure 122 and a widthwise support structure 124. The fore-aft support structure 122 and the widthwise support structure 124 may provide supplemental rigidity to the frame assembly 102 to ensure it does not substantially deflect under expected force inputs. More specifically, the support structures 122, 124 may be coupled to a mast 106, 108 on one end and to the base portion 110 on the other end. Further, in one non-exclusive example the widthwise support structure 124 may be coupled to the first mast 106 on one end and the second mast 108 on the other end. However, the widthwise support structure 124 may not be parallel to the cross-member 116 but rather be angled relative thereto.

The frame assembly 102 may also define at least one ballast channel 126. The ballast channel 126 may be formed as part of the base portion 110 to define a channel for ballast 128 to be positioned in. The ballast channel 126 may be sized to substantially restrict the ballast 128 from sliding relative to the base portion 110 once positioned therein. Further, one aspect of this embodiment includes a ballast clamp 130 positioned along the ballast channel 126 to selectively hold the ballast 128 in the ballast channel 126.

In one non-exclusive example of the frame assembly 102, the ballast 128 is a standard size cinder block and the ballast channel 126 and ballast clamp 130 are sized to accommodate the cinder block ballast 128. More specifically, the channel may have bottom portion and a side portion that cradle the cinder block ballast 128 therein. Further, the frame assembly 102 may have a width that corresponds with the amount of cinder block ballast 128 needed for the application. In this configuration, once the cinder block ballasts 128 are placed in the ballast channel 126, they may be substantially restricted from movement by the walls of the ballast channel 126.

In one aspect of this disclosure a stacked row of ballast 128 may be applied on top of the ballast 128 in the ballast channel 126. In this configuration, the ballast clamp 130 may have a clamp bar 132 that extends through an interior region of the cinder block ballast 128 on the second row. Further, the ballast clamp 130 may provide a clamping force on the ballast bar 132 towards the ballast channel 126 to thereby hold the cinder block ballast 126 within the ballast channel 126.

While a specific type of ballast 128 is described herein, this disclosure also considers ballasts 128 in other forms as well. In one non-exclusive example, the ballast 128 may be water tanks that can be filled with water to add ballast 128 to the frame assembly 102. Further still, other embodiments of this disclosure may use sand bags or the like to add ballast 128. Accordingly, any form of ballast 128 known in the art at the time of this disclosure is hereby considered.

In one aspect of this disclosure, an electronics box 134 may be coupled to the cross-members 116. The electronics box 134 may comply with characteristics defined by the National Electrical Manufacturing Association (NEMA) to allow for a standardized mounting configuration for components therein. As will be described in more detail with reference to the electrical components 104, the electronics box 134 may house and protect electrical devices of the RRU assembly 100 that may be susceptible to failure if exposed to extreme weather conditions.

The electronics box 134 may have a door that selectively allows entry to an interior region. When the door is closed, the interior region of the electronics box 134 may be substantially sealed from the surrounding environment. In one aspect of this disclosure, the electronics box 134 may substantially seal the interior region from any substantial moisture during rain, snow, or the like conditions.

Referring now to the electrical components 104, the first antenna 112 may be electrically coupled to a relay 136 and a radio head 138 via lines 140. The lines may be any size or gauge suitable to properly transmit signals between the corresponding components and provide requisite power thereto. The radio head 138 may further be coupled to a base transmission station 142 of the electronics box 134. Similarly, the second antenna 114 may be coupled to the base transmission station 142 of the electronics box 134 via one or more lines 140.

The base transmission station 142 may contain a power supply, backup battery, and system controller to name a few components of the base transmission station 142. The base transmission station 142 may communicate with, and power, the second antenna 114 to wirelessly access a data source that is a wireless communication location. Further, the base transmission station 142 may communicate with, and provide power to, the radio head 138, relay 136, and first antenna 112 to provide wireless access to the data source wireless communication location for users. Accordingly, the electrical components 104 may be coupled to one another to provide access to a data source wireless communication location over a wireless network.

The base transmission station 142 may be positioned on the frame assembly 102 of the modular RRU 100 such that the base transmission station 142 is positioned at the location of the modular RRU 100. As shown in FIG. 1, the base transmission station 142 may be positioned in the electronic box 134 and coupled to the cross-members 116. However, the base transmission station 142 may be positioned on the modular RRU 100 in any manner such that the base transmission station 142 is positioned at the location of the modular RRU 100 that will be apparent to those skilled in the relevant art(s) without departing from the spirit and scope of the disclosure.

The base transmission station 142 may be positioned at the location of the frame assembly 102 such that the frame assembly 102 and the modular RRU 100 may be positioned at a first location and in doing so the base transmission station 142 is also positioned at the first location of the frame assembly 102 and the modular RRU 100. For example, the frame assembly 102 and the modular RRU 100 may be positioned at the first location, which is positioned on the roof of a structure. In positioning the frame assembly 102 and the modular RRU 100 at the first location of the roof of the structure, the base transmission station 142 is also positioned at the first location of the roof of the structure.

Conventional transmission systems are split systems such that a portion of the equipment required for the conventional transmission systems are positioned at an outdoor position and a portion of the equipment for the conventional transmission system is positioned at an indoor location. Typically, the mast and/or elevating member and the antennas for the conventional transmission systems are positioned at the outdoor location. The outdoor location is positioned such that the antennas may engage wireless communication without the interference that may occur when positioned at the indoor location. Typically, the electrical components of the conventional transmission systems are positioned at the indoor position such that the electrical components are protected from the weather conditions. In doing so, the conventional transmission systems are split systems such that the mast and/or elevating member, antennas and other components are positioned at the outdoor position while the electrical components are positioned at the indoor position such that the outdoor position and the indoor position differ from each other.

The split system configuration of the conventional transmission systems significantly increases the complexity of installing the conventional transmission systems resulting in significant increases in the time and/or labor to install the conventional transmission systems as well as the significant increases in the cost to install the conventional transmission systems. Typically, the electrical components of the conventional transmission systems are installed at an indoor position that is a significant distance from the outdoor position that the mast and/or elevating member, antennas and other components are installed. Typically, the outdoor position of the mast and/or elevating member, antennas and other components is on the roof of a building and the indoor position of the electrical components of the conventional transmission systems are positioned within the building. Typically, the indoor position of the electrical components within the building is positioned in the basement of the building where the other facility resources and electrical components are positioned.

In doing so for the conventional system, extensive cabling is required to electrically connect the electrical components positioned in the indoor position of the basement of the building to the antennas and other components positioned at the outdoor position of the roof of the building. Such extensive cabling requires running the several cables from the outdoor position of the roof of the building to the indoor position of the basement of the building which could span several different floors depending on the size of the building. Such extensive cabling in the conventional system significantly increases the cost of the cabling as significantly more cabling is required to run from the outdoor position of the roof of the building to the indoor position of the basement of the building while also significantly increasing the amount of time required and/or labor required for the installers to adequately run the cable from the outdoor position of the roof of the building to the indoor position of the basement of the building.

Such an increase in time and/or labor also significantly increases the cost to run the cabling for the conventional system. Further, the complexity of the running the cabling within the building may trigger the building management to require that the cabling is run in a specific route and such a route may also increase the difficulty, amount of cabling, time, and/or labor in running the cabling. Such extensive cabling may also require a permit to be applied for and approved before the cabling is run also significantly adding to the cost and the time to complete the cabling. Conventional transmission systems that are split systems often require several days and/or weeks to adequately complete the cabling between the outdoor position and the indoor position.

Rather than being a split system where a first portion of the equipment is positioned at a first location and a second portion of the equipment is positioned at a second location as is the case for conventional transmission systems, the base transmission station 142 may be positioned at the location of the frame assembly 102 such that the frame assembly 102 and the modular RRU 100 may be positioned at the first location and in doing so the base transmission station 142 is also positioned at the first location of the frame assembly 102 and the modular RRU 100. In doing so, the modular RRU 100 may be positioned at the first location and thus also positioning the base transmission station 142 at the first location.

The extensive cabling required to connect the base transmission station 142 to the antennas 112 and 114, the relay 136, and the radio head 138 is simply not required due to the base transmission station 142, the antennas 112 and 114, the relay 136 and the radio head 138 all be positioned on the frame assembly 102 at the first location of the modular RRU 100. The cabling required to connect the base transmission station 142, the antennas 112 and 114, the relay 136, and the radio head 138 is significantly less than if split at the outdoor position and the indoor position and is simply ran within the frame assembly 102 as positioned at the first location. Building management is not required to dictate the route of the cabling and a permit is also not required due to the cabling simply being ran within the frame assembly 102 at the first location. Thus, the installation of the modular RRU 100 may be completed in a matter of hours rather than days and weeks as compared to the split system of the conventional transmission systems thereby significantly decreasing the amount of time required for installation as well as the cost.

The positioning of the antennas 112 and 114, the relay 136, the radio head 138 at the first location of the modular RRU 100 as well as the positioning of the base transmission station 142 at the first location of the modular RRU 100 and the cabling connecting each may also include any other components associated with the modular RRU 100. In this example, the components are positioned at the first location of the modular RRU 100 and any required cabling occurs within the frame assembly 102 and does not require cabling to a second location that differs from the first location of the modular RRU 100.

In one aspect of this disclosure, the base transmission station 142 may include a heating source and a cooling source. The heating source may be in the form of an electronic heating assembly that can selectively increase the temperature of interior portion of the electronics box 134 when the surrounding temperatures drop below a temperature threshold. Similarly, the cooling source may selectively cool the interior portion of the electronics box when the surrounding temperatures rise above a temperature threshold. The temperatures thresholds may be selected to ensure that the interior portion of the electronics box 134 remains within an operating temperature of the base transmission station 142.

In one aspect of this disclosure, the base transmission station 142 may utilize a convection heat cooling system to cool the interior portion of the electronics box 134. The convection heat cooling system may not require air movement outside of the interior region and therefor provide a more secure environment for the base transmission station 142.

In yet another aspect of the electronics box 134, the interior region may have a battery compartment that is separate from the remaining components of the base transmission station 142. In this configuration, the temperature of the compartment containing the remaining components of the base transmission station 142 may be managed separately from the compartment in which the batteries are located.

The base transmission station 142 may provide all of the power required by any of the electrical components 104. The electrical components 104 when aligned appropriately with a transmission system positioned at a different location may establish a wireless link between the electrical components 104 of the modular RRU 100 and the electrical components of the transmission system positioned at the different location. In doing so, a significant amount of Gigabits per second of network capacity may flow via the wireless link between the electrical components 104 of the modular RRU 100 and the electrical components of the transmission system positioned at the different location. For example, the amount of Gigabits per second of network capacity may range from less than 1 Gigabit per second to 100 Gigabits per second. In another example the amount of Gigabits per second of network capacity may exceed 100 Gigabits per second. Any amount of Gigabits per second of network capacity may flow via the modular RRU 100 that will be apparent to those skilled in the relevant art(s) without departing from the spirit and scope of the disclosure.

More specifically, the base transmission station 142 may have an uninterruptable power supply that manages and provides power to all of the electrical components 104 to maintain the wireless link. Further, the base transmission station 142 may have a single power input 144 that provides power to all of the electrical components 104 through the base transmission station 142 to maintain the wireless link. Rather than have significant cabling that is ran from the antennas positioned at the outdoor position to the power components positioned at the indoor position of the conventional transmission systems to provide the power required to maintain the wireless link of the conventional transmission systems, the base transmission station 142 may simply have the single power input 144 that couples to an external power supply to obtain power to adequately maintain the wireless link.

The external power supply is positioned at a location that differs from the location of the modular RRU 100. The base transmission station 142 may simply receive the power from the external power supply via the single power input 144 to generate the appropriate power to provide to the electrical components 104 to maintain the wireless link. For example, the modular RRU 100 may be positioned on the roof of a building. The single power input 144 may couple to a single 115/120V, 20 A outlet as positioned on the roof of the building in order for the base transmission power 142 to obtain the power to adequately power the electrical components 104 to establish the wireless link. In doing so, building management is simply required to furnish a single electrical outlet for the single power input 144 to couple to rather than extensive cabling and power sources as required with the conventional transmission systems.

Further still, the electrical demands of the electrical components 104 may be decreased sufficiently to allow the entire modular RRU assembly 100 to be powered by a single 115/120V, 20 A electrical line. In other words, the entire modular RRU assembly 100 may be powered by coupling a standard electrical connector to household power grid. As noted above, the base transmission station 142 manages and provides power to the electrical components 104 such that a wireless link may be established to flow a significant amount of Gigabits per second of network capacity. In doing so, the base transmission station 142 may streamline the power required by the base transmission station 142 to then provide power to the electrical components 104 such that the power required by the base transmission station 142 is of decreased power levels. For example, the base transmission station 142 may require a single 115/120V, 20 A electrical line in order to provide power to the electrical components 104 to adequately establish the wireless link to flow the significant amount of Gigabits per second of network capacity.

Conventional transmission systems require significant amounts of power in order for the antennas of the conventional transmission systems to establish the wireless link. In doing so, conventional transmission systems require significant amounts of power that cannot be delivered by a single 115/120V, 20 A electrical line but rather requires several different electrical lines that have significantly more capacity. In doing so, the conventional transmission systems require a specialized electrician that is licensed to engage significantly high powered systems to establish the high power electrical lines and cabling and may even require a permit to establish such high power electrical lines and cabling. Again, the cost and the time to install the conventional transmission systems significantly increases with the specialized electrician required to establish the high power electrical lines and cabling.

Rather than requiring a specialized electrician and even a permit to establish the high power electrical lines and cabling of the conventional transmission systems, installation of the modular RRU 100 simply requires standard licensed electrician to establish the single 115/120V, 20 A electrical line via the single power input 144. The decreased power requirements of the base transmission station 142 to power the electrical components 104 to establish the wireless link significantly decreases the time and cost to install the modular RRU 100. The modular RRU 100 may require that a single 115/120V, 20 A electrical line be established for the base transmission station 142 to power the electrical components 104 to establish the wireless link.

The base transmission station 142 may then convert the power received from the external power supply via the single power input 144 to the appropriate power levels associated with the electrical components 104 of the modular RRU 100 thereby enabling the electrical components 104 to be powered by the external power supply. As noted above, the external power supply may provide power via the single power input 144 to the base transmission station 142 via a standard AC electrical line such as a standard single 115/120V, 20 A electrical line. However, each of the electrical components 104 may require power that differs from the power provided by the external power supply via the single power input 144. For example, the electrical components may operate on DC power rather than AC power and/or operate off of AC power that differs from the power provided by the standard single 115/120V, 20 A electrical line. The base transmission station 142 may convert the power provided by the external power supply via the single power input 144 to power that may be consumed by each of the electrical components 104 of the modular RRU 100 thereby enabling the electrical components 104 to be powered by the external power supply rather than requiring additional power supplies to adequately power the electrical components 104.

For example, the external power supply may provide the standard single 115/120V, 20 A electrical line to the single power input 144. However, each of the electrical components 104 may operate at 48 VDC. Without converting the standard single 115/120V, 20 A electrical line provided by the external power supply to the single power input 144, the power provided by the external power supply is irrelevant and external power sources would be required to power each of the electrical components 104. However, the base transmission station 142 may convert the standard single 115/120V, 20 A electrical line provided by external power supply to the single power input 144 to 48 VDC thereby providing the appropriate power to each of the electrical components 104 to via the standard single 115/120V, 20 A electrical line.

In doing so, the electrical components 104 of the modular RRU 100 may be adequately powered by power provided by the external power supply based on the base transmission station 142 converting the power provided by the external power supply to the appropriate power levels for each of the electrical components 104. The base transmission station 142 may convert any type of power provided by the external power supply to any power level that is required by each of the electrical components 104 to operate such that a single external power supply is required to power the electrical components 104 of the modular RRU 100 that will be apparent to those skilled in the relevant art(s) without departing from the spirit and scope of the disclosure.

The base transmission station 142 may also provide a communication interconnection such that various types of communication lines may interface with the modular RRU 100 and/or be converted to different communication lines. Each location that the modular RRU 100 may be installed may present different communication lines to interface with as well as provide different environments that may require the adaptation of communication lines to adequately provide wireless communication to the location that the modular RRU 100 is positioned. In doing so, the communication interconnection of the base transmission station 142 may provide the modular RRU 100 with the flexibility to interconnect with any type of communication lines provided at the location that the modular RRU 100 is installed.

For example, the communication interconnection provided by the base transmission station 142 may provide an interconnection for copper twisted pair cables, coaxial cables, fiber optic cables, CAT-4/CAT-5/CAT-6 Ethernet type connections. In doing so, the communication interconnection of the base transmission station 142 may provide the modular RRU 100 with the flexibility to interconnect with copper twisted pair cables, coaxial cables, fiber optic cables, and/or Ethernet type cables based on the communication lines required by the location that the modular RRU 100 is positioned to provide wireless communication to the location. Rather than having to add additional equipment to the modular RRU 100 to adequately interface with the communication lines required by the location that the modular RRU 100 is positioned, the communication interconnection of the base transmission station 142 may provide the flexibility to adapt to the communication lines of the location without the added time and cost of adding additional equipment.

For example, the location that the modular RRU 100 is to be installed is on a low rise building of less than 100 m. The location of the modular RRU 100 positioned on the low rise of the building of less than 100 m provides the opportunity to connect to the communication lines of the building via Ethernet cable. The cost of Ethernet cables are significantly less than fiber optic cables. The ease of installation of Ethernet cables is also significantly less than fiber optic cables thereby decreasing the time required to install the Ethernet cables as compared to fiber optic cables resulting in a significant decrease in cost installation. In such an example, the flexibility of communication interconnection provided by the base transmission station 142 enables the modular RRU 100 to interconnect with the low rise building of less than 100 m with Ethernet cables. In doing so, the cost of the installation of the modular RRU 100 may be decreased due to the decreased cost of the Ethernet cables as well as the decrease in cost in the ease of installation of the Ethernet cables as compared to fiber optic cables without sacrificing performance due to the low rise of the building that the modular RRU 100 is installed.

However, the performance in providing adequate communication via the Ethernet cables is limited in distance. For example, Ethernet cables may provide adequate communication up to 100 m and then the quality of the communication provided by the Ethernet cables decreases significantly after 100 m. In another example, location that the modular RRU 100 is installed is on a high-rise building. Due to the position of the modular RRU 100 on the high-rise building, the distance to run the cabling to provide communication to the high-rise building is significantly greater than 100 m such that the performance of Ethernet cables would fail to adequately provide communication to the high-rise building. The flexibility of the communication interconnection provided by the transmission station 142 provides the interconnection of fiber optic cables and the range to provide adequate communication via fiber optic cables is significantly greater than 100 m. In doing so, the flexibility of the communication interconnection of the transmission station 142 provides the ease of installation of fiber optic cables when the location that the modular RRU 100 is to be positioned requires a distance that exceeds the performance of Ethernet cables, coaxial cables, and/or copper twisted pair cables.

Further, the flexibility of the communication interconnection provided by the base transmission station 142 may also provide the adaptability of the modular RRU 100 to interface with different types of radio equipment and/or other communication equipment positioned at the location that the modular RRU 100 is positioned and/or on the modular RRU 100 itself. Different types of radio equipment and/or communication communicate may communicate via twisted pair copper cables and/or fiber cables and so on. The communication interconnection provided by the base transmission station 142 provides the adaptability for the modular RRU 100 to easily interface with any type of radio equipment and/or communication equipment.

For example, the first antenna 112 may require a fiber optic connection and the second antenna 114 may require a copper twisted pair connection. The communication interconnection of the base transmission station 142 provides the flexibility to adapt to both the fiber optic connection of the first antenna 112 and the copper twisted pair connection of the second antenna 114. In doing so, the base transmission station may 142 may adequately communicate with both the first antenna 112 and the second antenna 114 to provide the diversity in the capabilities of both the first antenna 112 and the second antenna 114 to provide wireless communication to location that the modular RRU 100 is positioned. The communication interconnection of the base transmission station 142 may provide an interconnect for twisted pair copper cables, fiber optic cables, coaxial cables, Ethernet cables, T1 cables, T3 cables and/or any other type of communication cables to enable the modular RRU 100 to communicate with the location that the modular RRU 100 is positioned and/or any communication equipment positioned on the modular RRU 100 and/or at the location that will be apparent to those skilled in the relevant art(s) without departing from the spirit and scope of the disclosure.

The base transmission station 142 may also provide a controller that manages the operations of the modular RRU 100. The controller may transfer the management of the operations of the modular RRU 100 to the position of the modular RRU 100 such that modular RRU 100 is not required to lean on inflexible centralized racks of communication equipment, such as a data center, to manage the operations of the modular RRU 100. As noted above, conventional transmission systems are split systems in that the mast assembly that includes the antenna is positioned at an outdoor location and then the management system of the conventional transmission systems are typically located in an indoor location. Typically, the management systems of the conventional transmission systems include an inflexible centralized rack of communication equipment positioned in the building that the conventional transmission system is required to provide wireless communication to and/or at positioned off site at data centers.

Rather than having to lean on an inflexible centralized rack of communication equipment positioned at a different location than the modular RRU 100, the controller of the base transmission station 142 may manage the operations of the modular RRU 100 while being positioned on the modular RRU 100. In doing so, the modular RRU 100 is not reliant upon external and inflexible centralized racks of communication equipment but rather manages the operations of the modular RRU 100 from the location of the modular RRU 100. Typically, conventional centralized racks of communication equipment are inflexible in that such centralized racks of communication equipment are programmed and/or designed to execute a single communication environment for the location. However, the communication environment for the location may be dynamic and may be constantly changing and the centralized rack of communication equipment may not be able to dynamically adapt to the changing communication environment for the location thereby negatively impacting the communication environment of the location.

However, the controller of the base transmission station 142, may dynamically adjust to the dynamically changing communication environment for the location that the modular RRU 100 is positioned. For example, the controller may manage the routing protocols and/or networking layers of the numerous different communication entities that the modular RRU 100 may engage while providing wireless communication to the location that the modular RRU 100 is positioned. Rather than relying on the inflexibility of the centralized rack of communication equipment that may be limited to only bridging Layer 1 and Layer 2 networking, the controller of the base transmission system 142 may provide Layer 3 and Layer 4 networking as well as navigate the complexity of networking with numerous different communication entities in a mesh networking environment.

The controller of the base transmission station 142 may also dynamically adjust to the dynamically changing environment of the radio equipment not only positioned on the modular RRU 100 but also the dynamically changing environment of the wireless communication location that the modular RRU 100 is in wireless communication with as the wireless communication location may include antennas and/or satellites and so on that are included in a dynamically changing environment. The controller of the base transmission station 142 may continuously monitor the radio equipment positioned on the modular RRU 100 and may dynamically adjust the operation of the modular RRU 100 to account for the dynamically changing alignment and/or attenuation and so on resulting from the radio equipment positioned on the modular RRU 100.

The controller of the base transmission station 142 may also continuously monitor the wireless communication transmitting from the wireless communication location to the modular RRU 100 to account for the dynamically changing transmission signal wirelessly transmitted from the wireless communication location. In doing so, the cost of the modular RRU 100 may be significantly decreased as radio equipment that is positioned on the modular RRU 100 does not require sophisticated controllers associated with each piece of radio equipment to account for changes in the radio equipment. Rather, passive radio equipment may be installed on the modular RRU 100 without the sophisticated controllers as the controller of the base transmission station 142 eliminates the need for such sophisticated controllers thereby significantly decreasing the cost of the radio equipment positioned on the modular RRU 100.

The controller of the base transmission station 142 may also provide additional modularity to the modular RRU 100. Each location that the modular RRU 100 may be positioned may have different requirements and/or needs to adequately establish wireless communication to the location via the modular RRU 100. Further, the communication environment of the location may dynamically change such that the requirements and/or needs of the location to adequately establish wireless communication to the location via the modular RRU 100 may differ from when the modular RRU 100 was initially installed. Rather than having to add additional equipment to the modular RRU 100 and/or have the modular RRU 100 connect to additional equipment positioned at a position different than the modular RRU 100, the controller of the base transmission station 142 may dynamically adjust to the dynamically changing communication environment of the location.

In another aspect of this disclosure, the frame assembly 102 may have one or more loading coupler 146 positioned thereon. The loading coupler 146 may provide a location for a loading device such as a boom arm, crane, or the like to couple a hooking mechanism to the RRU assembly 100 to thereby lift and move the RRU assembly 100. In one aspect of this embodiment, there may be a loading coupler 146 positioned on each corner of the base portion 110. In this configuration, the loading device may couple a hooking mechanism to each of the loading couplers 146 to lift and transport the RRU assembly 100. The number and location of the loading couplers 146 may be such that the RRU assembly 100 remains in the upright orientation during transportation and movement by boom arm or the like.

In one aspect of this disclosure, the RRU assembly 100 is sized to be easily transported on a boom truck or the like and deployed on a rooftop or other surface. In this aspect of the disclosure, the RRU assembly 100 can be assembled and stored at a remote storage facility. When the RRU assembly 100 is needed, a boom truck may come to the remote storage facility to pickup the RRU assembly 100. The boom truck may couple a boom coupler to the loading coupler 146 of the RRU assembly 100 and lift the RRU assembly 100 onto a bed of the boom truck.

The RRU assembly 100 may be secured on the bed of the boom truck and the boom truck may travel to the deployment location of the RRU assembly 100. In one example of this disclosure, the deployment location may be a rooftop. Once the boom truck arrives at the deployment location, the RRU assembly 100 may be unsecured from the bed of the boom truck and the boom coupler may be coupled to the loading couplers 146 of the RRU assembly 100. Next, the boom arm may raise the RRU assembly off the bed of the truck and up to the rooftop. Once the RRU assembly 100 is in the proper rooftop location, the boom coupler may be released from the loading coupler 146 and the boom truck may no longer be required for the remaining installation of the RRU assembly 100.

Next, the RRU assembly 100 may be coupled to an electrical source through one or more power inputs 144. The power inputs may be coupled to a standard electrical outlet that does not require higher-than normal power. In the U.S. for example, the power input 144 may be a standard 3-prong coupler that couples to an outlet delivering about 120 volts of alternating current (AC). However, the power inputs 144 and the RRU assembly 100 may also be configured to work with other standards as well. For example, the power inputs 144 may be for a European standard voltage such as about 220-240 volts instead.

Regardless of the electrical standards of the region or country where the RRU assembly 100 is being installed, this disclosure contemplates implementing electrical components 104 that only require the most widely available electrical demands. In other words, this disclosure contemplates the simplest possible electrical coupling configuration for the RRU Assembly 100. More specifically, the RRU assembly 100 is specifically designed so that it may be installed in many different locations without requiring additional electrical work. In the U.S., the entire RRU assembly 100 may be powered by plugging a single three-pronged power input 144 into an outlet on the rooftop of the building.

Another aspect of the RRU assembly 100 is the weight density of the RRU assembly 100. More specifically, local building codes often determine the amount of weight a roof should be able to support before requiring supplemental structural reinforcements. This is often expressed as a load over an area. For example, in the U.S. the load on a roof is often expressed as pounds per square foot (psf). In one non-exclusive example, a standard flat roof may be rated to sustain consistent or live load of about 100 psf before requiring a structural permit.

The RRU assembly 100 may be sized to ensure it can be placed on the corresponding roof without exceeding the live load limits. More specifically, the area of the base portion 110 that contacts the roof or underlying surface and the weight of the ballast 128 and the remaining frame assembly 102 and electrical components 104 may be specifically designed to remain under the live load limit. As one example, the base portion 110 may be rectangular in shape and have a width of about four feet and a length of about six feet. In this example, the base portion 110 may have an area of approximately twenty-four square feet. In this example, if the live load limit for the rooftop on which the RRU assembly 100 is being installed is one-hundred psf, the RRU assembly may weigh up to twenty-four hundred pounds (the base portion 110 surface area of twenty-four square feet multiplied by the live load limit of one-hundred pounds per square foot).

In one aspect of this disclosure, the surface area of the base portion 110 may be sized to ensure that the RRU assembly 100 is the smallest possible size while still not exceeding live load limits of the structure on which the RRU assembly 100 will be placed. For example, on a structure with a low live load limit, the surface area of the base portion 110 may be increased. More specifically, if the RRU assembly 100 weighs twenty-four hundred pounds and the live roof load is only fifty psf, the surface area of the base portion will be at least forty-eight square feet. Accordingly, the surface of the base portion 110 may be specifically sized to ensure the RRU assembly 100 does not exceed live load limits of the structure on which it is being placed.

In one aspect of this disclosure, the RRU assembly 100 may not penetrate any portion of the surface on which it is placed. More specifically, a rubber mat or the like may be placed between the bottom surface of the base portion 110 and the underlying surface to ensure that the underlying surface is not damaged. More specifically, since the RRU assembly 100 may be placed on a rooftop surface, the underlying surface may be specifically formed to avoid water penetration. Accordingly, allowing the RRU assembly 100 to be placed on top of the underlying surface without compromising the permeability of the underlying surface provides for easy installation of the RRU assembly 100 without requiring drilling holes in the underlying surface.

While specific weights, sizes, data transfer speeds, and the like have been discussed in examples herein, this disclosure also considers embodiments that contain variants not specifically discussed. Accordingly, this disclosure also considers implementing the teachings discussed herein with different weights, sizes, data transfer speeds and the like.

While an exemplary embodiment incorporating the principles of the present application has been disclosed hereinabove, the present application is not limited to the disclosed embodiments. Instead, this application is intended to cover any variations, uses, or adaptations of the application using its general principles. Further, this application is intended to cover such departures from the present disclosure as come within known or customary practice in the art to which this present application pertains and which fall within the limits of the appended claims.

The terminology used herein is for the purpose of describing particular illustrative embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations).

What is claimed is:

1. A method for providing wireless telecommunications, comprising:
   providing a modular remote radio unit (RRU) capable of wirelessly transmitting data;
   placing the modular RRU on a boom truck with a boom arm;
   transporting the remote radio unit to a deployment location;
   setting the modular RRU on a structure at the deployment location by lifting the modular RRU off the boom truck with the boom arm;
   electrically coupling a power input of the modular RRU to a power source to power the modular RRU; and
   transmitting and receiving wireless data with the modular RRU unit after the power input is coupled to the power source;
   wherein the setting step further comprises:
      setting the modular RRU at the deployment location with a plurality of electrical components previously coupled to a frame assembly of the modular RRU, wherein the plurality of electrical components is previously coupled to the frame assembly of the modular RRU before transporting the modular RRU to the deployment location; and
      aligning the plurality of electrical components when the modular RRU is positioned at the deployment location with a wireless communication location to establish a wireless link to provide wireless data transfer with the wireless communication location, wherein the wireless communication location differs from the deployment location of the modular RRU.

2. The method of claim 1, further wherein the setting the remote radio unit on a structure step does not require fastening the remote radio unit to the structure with a fastener.

3. The method of claim 1, further comprising identifying a load limit of the structure and modifying the size and weight of the remote radio unit to comply with the load limit.

4. The method of claim 1, wherein the setting step further comprises:
   setting the modular RRU at the deployment location with a base transmission station previously coupled to the frame assembly of the modular RRU; and
   providing power to the electrical components to enable the electrical components to establish the wireless link with the wireless communication location.

5. The method of claim 4, wherein the setting step further comprises:
   coupling a single power input for the modular RRU to an external power source to establish a single electrical line with the external power source positioned at a location different from the location of the modular RRU; and
   providing to the base transmission station from the external power source via the single power input power from the external power source that is distributed by the base transmission station to the electrical components to enable the electrical components to establish the wireless link.

6. The method of claim 5, further comprising:
   providing power to the electrical components to establish the wireless link based on a decreased level of power provided by the external power source to the base transmission station via the single power input, wherein the distribution of the decreased level of power from the external power source to the base transmission station does not require more than a single electrical line.

7. The method of claim 6, further comprising:
   converting the external power provided by the external power source to the decreased level of power, wherein the decreased level of power is a power level that each electrical component included in the assembly requires to operate.

8. The method of claim 7, further comprising:
   establishing with the single power input a single electrical line with a 110/120V, 20 A electrical connection for the external power source.

9. The method of claim 1, further comprising:
   providing a communication interconnection to enable communication from the base transmission station via a plurality of wireline communication cables thereby enabling the base transmission station to communicate via different modes of communication, wherein each wireline communication cable that interconnects with the communication interconnection transmits communication signals via a different mode of communication.

* * * * *